(12) United States Patent
Ohsawa et al.

(10) Patent No.: US 10,779,411 B2
(45) Date of Patent: Sep. 15, 2020

(54) SENSOR SHEET-CONTAINING EXTERIOR COMPONENT, SENSOR SHEET UNIT, AND METHOD FOR MANUFACTURING SENSOR SHEET-CONTAINING EXTERIOR COMPONENT

(71) Applicant: POLYMATECH JAPAN CO., LTD., Saitama, Saitama (JP)

(72) Inventors: Yuta Ohsawa, Saitama (JP); Kota Yamazaki, Saitama (JP); Yoshifumi Honmatsu, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 374 days.

(21) Appl. No.: 15/112,208

(22) PCT Filed: Jan. 27, 2015

(86) PCT No.: PCT/JP2015/052163
§ 371 (c)(1),
(2) Date: Jul. 18, 2016

(87) PCT Pub. No.: WO2015/115411
PCT Pub. Date: Aug. 6, 2015

(65) Prior Publication Data
US 2016/0338198 A1 Nov. 17, 2016

(30) Foreign Application Priority Data
Jan. 28, 2014 (JP) .................. 2014-012950

(51) Int. Cl.
*H05K 1/18* (2006.01)
*H03K 17/96* (2006.01)
(Continued)

(52) U.S. Cl.
CPC ............. *H05K 1/18* (2013.01); *H03K 17/962* (2013.01); *H03K 17/9622* (2013.01);
(Continued)

(58) Field of Classification Search
CPC .... H05K 1/18; H03K 17/962; H03K 17/9622; H03K 2217/960755; G06F 3/044
(Continued)

(56) References Cited

U.S. PATENT DOCUMENTS 5,509,057 A * 4/1996 Anello ................. H04M 1/18
379/143
2012/0020056 A1* 1/2012 Yamagata ......... G02F 1/133308
362/97.1
(Continued)

FOREIGN PATENT DOCUMENTS

CN 103309536 A 9/2013
JP 2010-179735 A 8/2010
(Continued)

OTHER PUBLICATIONS

Office Action for Chinese Patent App. No. 201580003495.6 (dated Aug. 20, 2018).
(Continued)

*Primary Examiner* — Melissa J Koval
*Assistant Examiner* — Courtney G McDonnough
(74) *Attorney, Agent, or Firm* — Cermak Nakajima & McGowan LLP; Tomoko Nakajima

(57) ABSTRACT

A sensor sheet-containing exterior component includes an exterior member; a sensor sheet having a sensor electrode and disposed on a back surface of the exterior member; and a mounting plate that holds the sensor sheet in close contact with the exterior member, wherein the mounting plate has a front surface shape that substantially corresponds to a back surface shape of the exterior member and is configured to
(Continued)

engage with the exterior member, and a sensor sheet-fixing unit is provided between the mounting plate and the sensor sheet so as to fix the sensor sheet to the mounting plate along the front surface shape of the mounting plate.

13 Claims, 3 Drawing Sheets

(51) Int. Cl.
   *G01D 11/24* (2006.01)
   *G06F 3/044* (2006.01)

(52) U.S. Cl.
   CPC .............. *G01D 11/24* (2013.01); *G06F 3/044* (2013.01); *H03K 2217/960755* (2013.01)

(58) Field of Classification Search
   USPC .......................................................... 324/686
   See application file for complete search history.

(56) References Cited

U.S. PATENT DOCUMENTS

| | | | |
|---|---|---|---|
| 2013/0162582 A1* | 6/2013 | Hatano | ................. B60K 37/06 |
| | | | 345/173 |
| 2015/0253912 A1 | 9/2015 | Liu et al. | |

FOREIGN PATENT DOCUMENTS

| | | | |
|---|---|---|---|
| JP | 2011-0198125 A | 10/2011 | |
| JP | 2012-053592 A | 3/2012 | |
| JP | 2012-230805 A | 11/2012 | |
| WO | WO2011/142332 A1 | 11/2011 | |

OTHER PUBLICATIONS

International Search Report for PCT Patent App. No. PCT/JP2015/052163 (dated Apr. 28, 2015) with English translation thereof.

* cited by examiner

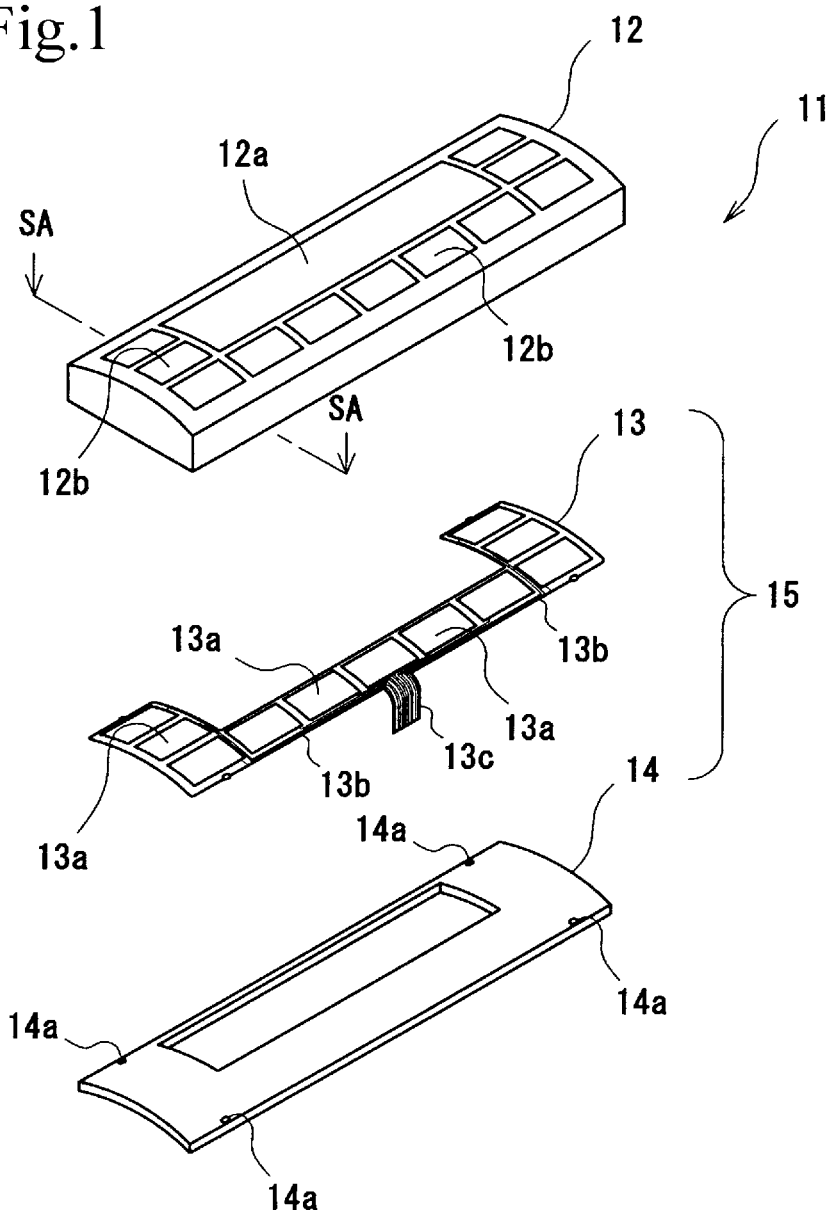
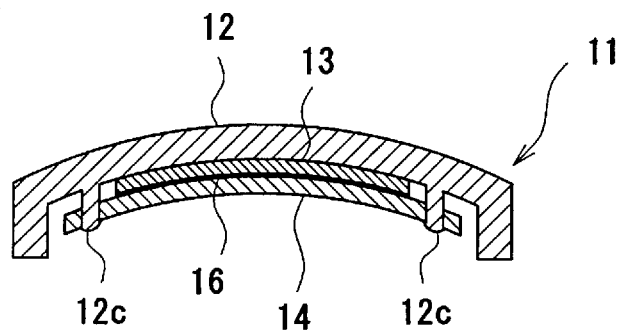

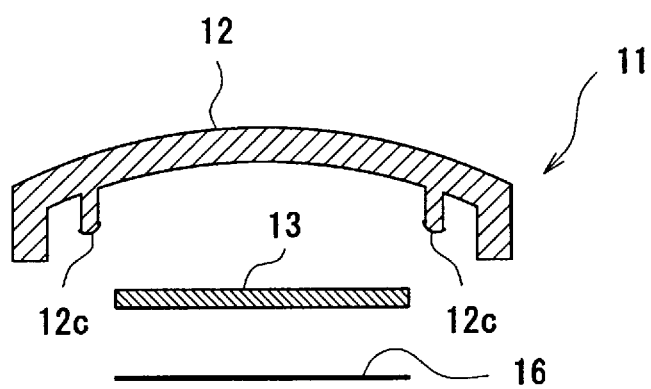
Fig.3
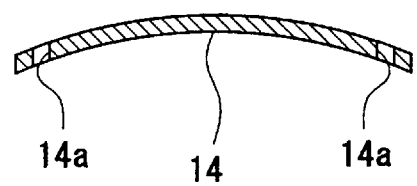
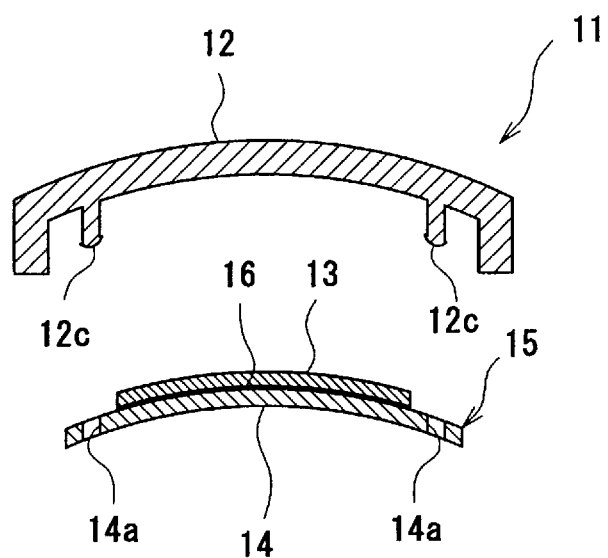
Fig.4

SENSOR SHEET-CONTAINING EXTERIOR COMPONENT, SENSOR SHEET UNIT, AND METHOD FOR MANUFACTURING SENSOR SHEET-CONTAINING EXTERIOR COMPONENT

This application is a national phase entry under 35 U.S.C. § 371 of and claims priority under 35 U.S.C. § 119 to PCT Patent Application No. PCT/JP2015/052163, filed on Jan. 27, 2015, which claims priority under 35 U.S.C. § 119 to Japanese Patent Application No. 2014-012950, filed Jan. 28, 2014, both of which are incorporated by reference.

TECHNICAL FIELD

The present invention relates to a sensor sheet-containing exterior component which includes a sensor sheet used for various electronic devices and integrally formed with an exterior member, and a sensor sheet unit for mounting the sensor sheet on the exterior member, and a method for manufacturing the sensor sheet-containing exterior component.

BACKGROUND ART

As described in International Publication No. WO 2011/142332 (PTL 1), in a generally known configuration of a sensor sheet-containing exterior component which includes a sensor sheet and an exterior member which are integrally formed, the sensor sheet is fixed to the back surface of a panel, which is the exterior member, by using an adhesive layer or a double sided tape.

CITATION LIST

Patent Literature

PTL 1: International Publication No. WO 2011/142332

SUMMARY OF INVENTION

Technical Problem

However, on the back surface of the exterior member, a plurality of ribs that increase the strength of the panel and bosses that fix the substrate and various components are provided. When the sensor sheet is bonded to the back surface of the exterior member having such protrusions and recesses, there is a problem that the sensor sheet is easily bent. Accordingly, when the sensor sheet is bonded on the exterior member by using a double sided tape or the like as the technique described in International Publication No. WO 2011/142332 (PTL 1), the sensor sheet needs to be bonded so as not to overlap those protrusions and recesses, which causes a problem of poor workability.

Further, when the sensor sheet is integrally formed with the exterior member as described above, the sensor sheet is not easily separated from the exterior member. As a result, if a fault is found in either the exterior member or the sensor sheet, both the exterior member and the sensor sheet need to be replaced.

The present invention has been made to overcome the above problem. That is, an object of the present invention is to provide a technique in which the sensor sheet can be easily mounted on the exterior member with accuracy. Further, another object of the present invention is to provide a technique in which the sensor sheet and the exterior member can be easily separated from each other.

Solution to Problem

In order to achieve the above objects, the present invention provides a sensor sheet-containing exterior component as described below.

That is, according to an aspect of the present invention, a sensor sheet-containing exterior component (hereinafter, also simply referred to as "exterior component") includes: an exterior member; a sensor sheet having a sensor electrode and disposed on a back surface of the exterior member; and a mounting plate that holds the sensor sheet in close contact with the exterior member, wherein the mounting plate has a front surface shape that corresponds to a back surface shape of the exterior member and is configured to engage with the exterior member, and a sensor sheet-fixing unit is provided between the mounting plate and the sensor sheet so as to fix the sensor sheet to the mounting plate along the front surface shape of the mounting plate.

Further, according to another aspect of the present invention, a sensor sheet unit, which is mounted for use on an exterior member, includes: a sensor sheet having a sensor electrode and disposed on a back surface of the exterior member; and a mounting plate that holds the sensor sheet in close contact with the exterior member, wherein the mounting plate has a front surface shape that corresponds to a back surface shape of the exterior member and is configured to engage with the exterior member, and a sensor sheet-fixing unit is provided between the mounting plate and the sensor sheet so as to fix the sensor sheet to the mounting plate along the front surface shape of the mounting plate.

Since the sensor sheet used for various electronic devices such as home electric appliances, audio devices and vehicle-mounted devices is provided, the present invention can be used as a touch sensor that detects capacitance change by indirectly touching the sensor electrode. Further, since the exterior member is provided on the front surface of the sensor sheet, the exterior member may have a function as a housing that protects the sensor sheet. Moreover, a variety of design can be applied to the exterior member.

Since the sensor sheet-fixing unit is disposed between the mounting plate and the sensor sheet so as to fix the sensor sheet to the mounting plate along the front surface shape of the mounting plate, the sensor sheet having a thin sheet shape can fix the sensor sheet to the mounting plate in the shape along the front surface shape of the mounting plate. Further, since the mounting plate has the front surface shape corresponding to the back surface shape of the exterior member, the exterior member and the mounting plate can engage together by bonding the exterior member and the mounting plate while the sensor sheet interposed therebetween can be in close contact with the exterior member and the mounting plate. In addition, by simply mounting the mounting plate on the exterior member, the sensor sheet can be mounted on the exterior member. This facilitates a mounting operation of the sensor sheet.

The expression "the front surface shape which corresponds to the back surface shape of the exterior member" as used herein means that the surface shape of the front surface of the mounting plate overlaps the surface shape of the back surface of the exterior member. However, the surfaces may not necessarily completely the same shape, and one or both of the surfaces may have a small irregularity or gap. In other words, the mounting plate may have any surface shape that can hold the sensor sheet along the back surface of the exterior member. In addition, the "front surface" refers to a surface on the operation surface of the exterior component, and the "back surface" refers to a surface opposite to the operation surface of the exterior component.

A mounting/dismounting unit that is detachable to the exterior member can be provided on the mounting plate. Since the mounting/dismounting unit that is detachable to the exterior member is provided on the mounting plate, the exterior member and the mounting plate can be separated. As a result, if a fault occurs in the exterior member or the sensor sheet, only the exterior member or the sensor sheet that has a fault can be repaired without replacing the entire exterior component. Moreover, since the sensor sheet unit is made up of the sensor sheet and the mounting plate which are integrally formed, the sensor sheet can be easily mounted on the exterior member with accuracy.

The first elastic member can be disposed between the exterior member and the sensor sheet. Although the front surface of the mounting plate has a shape corresponding to the back surface shape of the exterior member, there may be a case in which a decoration layer is provided on the back surface of the exterior member. In that case, a step may be formed on the interface of the decoration layer, or a step may be formed due to parting of the mold. However, since the first elastic member is provided, the front surface of the first elastic member can flexibly deform to follow the step, even if the step is small. Accordingly, the exterior member and the sensor sheet can be in close contact with each other. That is, if the first elastic member is not provided, it may be difficult to completely exclude an air layer, which leads to decrease in sensitivity due to an effect of the air layer. However, providing the first elastic member allows the sensor sheet to be in close contact with the exterior member and expel the air layer. Accordingly, the sensor sensitivity can be prevented from being affected.

The first elastic member may have a thickness of 50 μm or more and 700 μm or less. When the first elastic member has a thickness of 50 μm or more, a sufficient thickness for compression deformation can be ensured and a design allowance in mounting can be reliably absorbed. Further, when the thickness is 700 μm or less, there is little decrease in sensitivity caused by the increased thickness of the elastic member, and therefore, a fault in contact detection may hardly occur. More preferably, the thickness is 250 μm or less. When the first elastic member is provided, the distance between the front surface of the exterior member and the sensor sheet increases. However, if the thickness of the first elastic member is 250 μm or less, the adverse effect of the air layer due to absence of the first elastic member can be eliminated, and this is more effective compared with decrease in sensitivity due to the increased distance. Accordingly, compared with the case where the first elastic member is not provided, the sensitivity can be increased.

The second elastic member may be disposed between sensor sheet and the mounting plate. When the second elastic member is provided, the second elastic member can bring the sensor sheet to be in press contact with the exterior member while performing compression deformation. Accordingly, within the range of this compression deformation, errors in dimension accuracy can be absorbed.

Further, a method for manufacturing a sensor sheet-containing exterior component which includes an exterior member, a sensor sheet having a sensor electrode and disposed on a back surface of the exterior member, and a mounting plate that holds the sensor sheet in close contact with the exterior member, includes: fixing the sensor sheet to the mounting plate having a front surface shape that corresponds to a back surface shape of the exterior member by a sensor sheet-fixing unit that fixes the sensor sheet along the front surface shape of the mounting plate; and engaging the front surface of the mounting plate to which the sensor sheet is fixed with the back surface of the exterior member.

Since the sensor sheet is fixed to the mounting plate having a front surface shape that corresponds to a back surface shape of the exterior member by a sensor sheet-fixing unit that fixes the sensor sheet along the front surface shape of the mounting plate, the sensor sheet having a plate shape can fix the sensor sheet to the mounting plate in the shape along the front surface shape of the mounting plate. Further, since the mounting plate has the front surface shape that corresponds to the back surface shape of the exterior member, the sensor sheet interposed therebetween can be in close contact with the exterior member and the mounting plate by engaging the front surface of the mounting plate on which the sensor sheet is fixed with the back surface of the exterior member. In addition, by simply mounting the mounting plate on the exterior member, the sensor sheet can be mounted on the exterior member. This facilitates a mounting operation of the sensor sheet.

Advantageous Effects of Invention

According to the sensor sheet-containing exterior component and the sensor sheet unit of the present invention, the cost can be reduced since manufacturing can be easily performed. Further, since the exterior member and the sensor sheet can be easily separated from each other, partial repairmen can be easily performed.

According to a method for manufacturing the sensor sheet-containing exterior component of the present invention, the sensor sheet can be easily mounted on the exterior member with accuracy. As a result, the sensor sheet-containing exterior component can be manufactured with high yield and at inexpensive cost.

BRIEF DESCRIPTION OF DRAWINGS

FIG. 1 is an exploded perspective view of an exterior component according to a first embodiment of the present invention.

FIG. 2 is a schematic cross sectional view of the exterior component of FIG. 1 taken along the line SA-SA.

FIG. 3 is an exploded schematic cross sectional view of the exterior component of FIG. 2.

FIG. 4 is an exploded schematic cross sectional view which shows that the sensor sheet is mounted on the mounting plate of the exterior component of FIG. 2.

DESCRIPTION OF EMBODIMENTS

Figure 5:
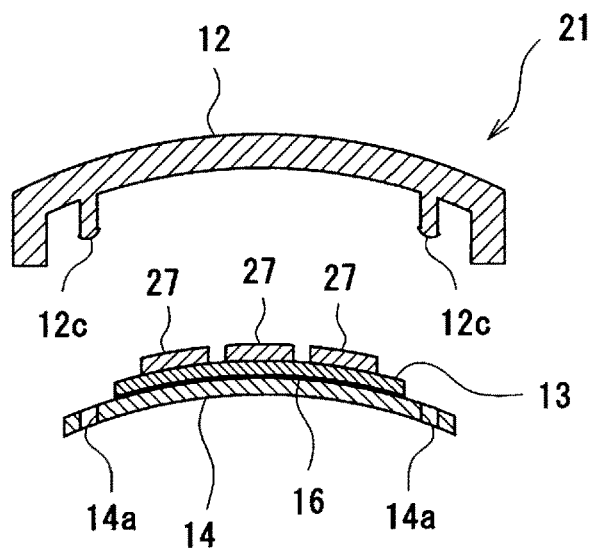
FIG. 5 is an exploded schematic cross sectional view corresponding to FIG. 4, which shows the exterior component that includes the first elastic member according to a second embodiment.

The present invention will be described in detail with reference to the embodiments. The same members in the embodiments are denoted by the same reference numbers, and the description thereof will be omitted. Further, the same materials, operation and effect are not described for the purpose of preventing duplication.

First Embodiment [FIG. 1 to FIG. 4]

In the present embodiment, an exterior component 11 is shown as an example of a panel disposed on the front side of an electronic device. As shown in FIG. 1, the exterior component 11 includes an exterior member 12, a sensor sheet 13 disposed on the back side of the exterior member 12, and a mounting plate 14 of disposed on the back side of the sensor sheet 13.

The exterior member 12 is made of a transparent hard resin or an opaque hard resin, and a front plate which is an operation surface has an outer shape curved in a dome shape. The exterior member 12 includes one display 12a and 11 sensor areas 12b. As shown in FIG. 2, fitting projections 12c having a back surface recessed in the shape along the front surface of the front plate are formed on the back surface of the exterior member 12 at positions which do not overlap the sensor areas 12b so that the mounting plate 14 is detachably attached to the fitting projections 12c.

The display 12a is an element which performs various displays. The exterior member 12 is preferably made of a transparent resin if it has an illuminating function. The sensor areas 12b are sensing areas, which correspond to sensor electrodes 13a of the sensor sheet 13. The sensor areas 12b preferably have uniform thickness to provide uniform sensitivity on all the sensor areas 12b. Further, in order to improve sensor sensitivity, the thickness of the sensor area 12b is preferably thin as long as it does not affect the strength of the exterior member 12 as a housing. If the sensor area 12b and the peripheral edge of the sensor area 12b have different thickness, it is preferable that the back surface of the exterior member 12 is formed in a flat surface without a step. This can prevent forming of an unnecessary space that may affect the sensitivity when the sensor sheet 13 is attached to the exterior member 12.

Specifically, the thickness of the sensor area 12b is preferably in the range from 1 mm to 3 mm. When the thickness is less than 1 mm, the strength as a housing may be insufficient. When the thickness is more than 3 mm, the sensor sensitivity may be lowered. The thickness of the peripheral edge of the sensor area 12b can be formed as appropriate depending on the design of the exterior component 11, independently from the sensor sensitivity.

The fitting projection 12c is a detachable fixation structure that can fit with a fitting receiving member 14a disposed on the mounting plate 14. Specific combinations of the fitting projection 12c and the fitting receiving member 14a include snap fittings, bosses and screws, recesses and projections that are press-fitted into the recesses, pairs of magnets and the like. When the fitting projection 12c fits in the fitting receiving member 14a of the mounting plate 14, the exterior member 12 and the mounting plate 14 are stable in an engagement state so that the mounting plate 14 and the sensor sheet 13 are fixed to the exterior member 12.

The sensor sheet 13 is generally formed in a thin sheet as shown in FIG. 3, and includes the sensor electrodes 13a on the plane of the sensor sheet 13 at positions corresponding to the sensor areas 12b of the exterior member 12 as shown in FIG. 1. Wirings 13b are disposed with one end extending from each sensor electrode 13a and the other end being connected to the terminal section 13c. A portion from the wiring 13b to the terminal section 13c extends outside the mounting plate 14. This can be folded in advance so as to be connected to the substrate or the like.

As seen in the cross section of the sensor sheet 13, a film base material is provided as a base, and the sensor electrodes 13a and a resist layer (not shown in the figure) are stacked on the front surface of the base. Further, an adhesive layer 16 may be provided as a sensor sheet-fixing unit on the entire back surface of the sensor sheet 13.

The resist layer is preferably formed of a film, since a thin film can reduce the distance between the exterior member 12 and the sensor electrode 13a, thereby ensuring high sensor sensitivity. Further, in this embodiment, the adhesive layer 16 is provided on the entire back surface of the sensor sheet 13. Accordingly, if a small step is formed by the front surface of the mounting plate 14, it does not cause a significant effect. The sensor sheet 13 can be in close contact with the mounting plate 14 while preventing entering of air bubbles. Alternatively, the adhesive layer 16 can be replaced with various adhesive layers including hot melt adhesive and thermal welding layers that can be thermally welded. Further, although the adhesive layer 16 can be provided on the entire back surface of the sensor sheet 13 or on part of the back surface such as on the outer periphery, it is preferable that the adhesive layer 16 is provided at a position where a step is formed by the mounting plate 14.

As shown in FIG. 3, the mounting plate 14 is a member having a front surface shape which corresponds to a back surface shape of the exterior member 12 and has a function of engaging the sensor sheet 13 with the exterior member 12 so as to hold the sensor sheet 13 in close contact with the exterior member 12.

The mounting plate 14 include the fitting receiving members 14a that detachably fit with the fitting projections 12c of the exterior member 12. The fitting receiving member 14a is a unit detachably attached to the exterior member 12. When the fitting receiving member 14a fits with the fitting projection 12c, the sensor sheet 13 fixed to the front surface of the mounting plate 14 is closely fixed to the exterior member 12 in the state of being in press contact with the back surface of the exterior member 12.

The mounting plate 14 is made of a hard resin. The mounting plate 14 may be made of the same hard resin as that of the exterior member 12, or alternatively, may be made of relatively hard rubber or elastomer. Specifically, the material preferably has a hardness of D60 or more in D hardness in accordance with JIS K6253. If the hardness is less than D60, there is a risk of the mounting plate 14 easily deforming, thereby causing an insufficient accuracy in mounting position or the like. Further, when the mounting plate 14 is made of a rubber material or elastomer, it is preferably configured to have a predetermined amount of flexibility so that it can be in press contact with the exterior member 12.

As shown in FIG. 4, in assembly of the exterior component 11, the back surface of the sensor sheet 13 is first fixed to the front surface of the mounting plate 14 via the adhesive layer 16 so that the sensor sheet 13 and the mounting plate 14 integrally form the sensor sheet unit 15. The sensor sheet 13 can be easily mounted on the mounting plate 14 since the sensor sheet 13 is mounted on a dome-shaped front surface of the mounting plate 14. This can be achieved by a simple operation compared with the case in which the sensor sheet 13 is fixed on a recess-shaped inner surface of the exterior member 12. Although the sensor sheet 13 can be curved along the front surface of the mounting plate 14 during mounting on the mounting plate 14, the sensor sheet 13 can also be deformed into the shape along the front surface of the mounting plate 14 or the back surface of the exterior member 12 before it is mounted on the mounting plate 14.

Then, the sensor sheet unit 15 is mounted on the exterior member 12. Mounting can be made only by inserting the fitting receiving members 14a formed on the sensor sheet unit 15 onto the fitting projections 12c of the exterior member 12. In this case, since the sensor sheet 13 is already fixed to the mounting plate 14, the sensor sheet 13 is not inclined or displaced during mounting of the mounting plate 14. Further, since the back surface shape of the exterior member 12 corresponds to the front surface shape of the mounting plate 14, the sensor sheet 13 interposed between the exterior member 12 and the mounting plate 14 is closely fixed at a position between the exterior member 12 and the mounting plate 14.

Since the mounting plate 14 is fixed to the exterior member 12 by fitting of the fitting projections 12c and the fitting receiving members 14a which is detachable, it is easy to separate the exterior member 12 and the mounting plate 14 from each other. Accordingly, when a defect is found in the exterior member 12 or the sensor sheet 13, they can be separated to replace only one of them.

Second Embodiment [FIG. 5]

An exterior component 21 of this embodiment differs from the exterior component 11 of the first embodiment in that it has a first elastic member 27 on the front surface of the sensor sheet 13. The first elastic member 27 is a member that improves adhesiveness between the sensor sheet 13 and the exterior member 12.

The first elastic member 27 is disposed on the front surface of the sensor sheet 13, and preferably has an outer shape in plan view larger than the sensor area 12b and the sensor electrode 13a, since it is preferable that the entire back surface of the sensor area 12b and the entire front surface of the sensor area 13a of the sensor sheet 13 are in close contact with each other. The first elastic member 27 may be disposed on the entire front surface of the sensor sheet 13. However, it is preferable that the first elastic members 27 are individually disposed at positions corresponding to the sensor areas 12b, since the first elastic members 27 easily perform compression deformation when individually provided, leading to reduction of compression load.

The first elastic member 27 preferably has a thickness in the range from 50 μm to 700 μm. When the thickness is less than 50 μm, there is a risk that a design allowance in mounting is not absorbed. On the other hand, when the thickness is more than 70 μm, there is a risk that the sensitivity is lowered, which causes a problem in contact detection. More preferably, the thickness is 250 μm or less. When the thickness is 250 μm or less, the sensitivity can be easily improved compared with the case which does not use the first elastic member 27.

The first elastic member 27 may be made of a soft rubber, elastomer, or a foam such as sponge. If there is irregularity on the back surface of the exterior member 12, the first elastic member 27 can be in close contact with the irregularity while following the irregularity. Further, a material that is resistant to breakage in repeated use is preferable.

The materials having such functions include cross-linked rubber such as natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluoride rubber, urethane rubber and silicone rubber, styrene-butadiene block copolymer and hydrogenated polymer thereof, styrene-isoprene block copolymer and hydrogenated polymer thereof, and thermoplastic elastomer such as styrene thermoplastic elastomer, olefin thermoplastic elastomer, vinyl chloride thermoplastic elastomer, polyester thermoplastic elastomer, polyurethane thermoplastic elastomer and polyamide thermoplastic elastomer. In particular, rubber or elastomer material is preferably used since a foam has low dielectric rate. In view of heat resistance, weather resistance and flexibility, silicone rubber is advantageously used. Further, in view of durability and adhesiveness, polyurethane thermoplastic elastomer, resin and urethane rubber are also advantageously used.

The first elastic member 27 preferably has hardness of A60 or less in A hardness in accordance with JIS K6253. When the hardness is more than A60, the compression load becomes large, which may cause distortion in the exterior member 12. Further, if there is irregularity on an adhering surface, followability to the irregularity may be insufficient.

When transparency is not required for the sensor areas 12b, a filler that increases dielectric rate (dielectric filler) such as fine particles of barium titanate can be added to the first elastic member 27. This increases the sensor sensitivity. Moreover, the sensor sensitivity of the exterior component 21 is less likely to decrease when the first elastic member 27 has a large thickness.

In the exterior component 21, the first elastic member 27 is disposed between the exterior member 12 and the sensor sheet 13. Accordingly, if there is a step on the back surface of the exterior member 12, the first elastic member 27 can flexibly deform to follow the step, thereby preventing an air layer from being generated. Accordingly, effects due to variation in sensor sensitivity caused by an air layer can be prevented, even if there is a step on the back surface of the exterior member 12.

Figure 6:
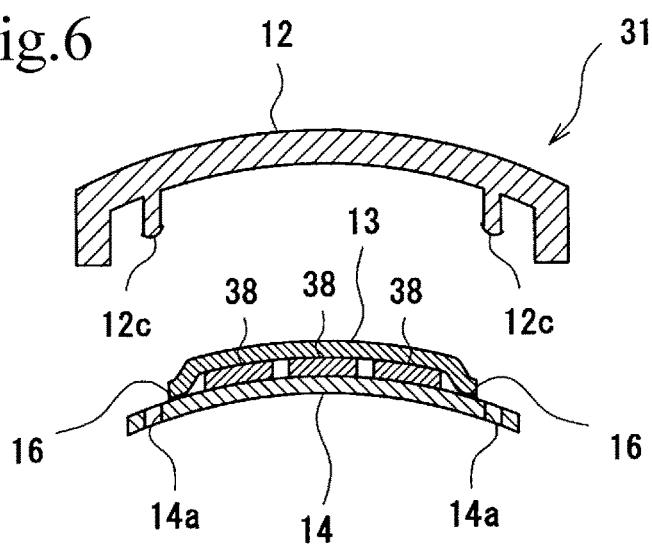
FIG. 6 is an exploded schematic cross sectional view corresponding to FIG. 4, which shows the exterior component that includes the second elastic member according to a third embodiment.

Third Embodiment [FIG. 6]

An exterior component 31 of this embodiment differs from the exterior component 11 of the first embodiment in that it has a second elastic member 38 made of an elastic material on the back surface of the sensor sheet 13. The second elastic member 38 is also a member that improves adhesiveness between the sensor sheet 13 and the exterior member 12.

The second elastic member 38 can be fixed to the back surface of the sensor sheet 13 or the front surface of mounting plate 14. Preferably, the second elastic member 38 has an outer shape in plan view larger than the sensor area 12b and the sensor electrode 13a, since it is preferable that the entire back surface of the sensor area 12b and the entire front surface of the sensor area 13a of the sensor sheet 13 are in close contact with each other. The second elastic member 38 may be disposed on the entire back surface of the sensor sheet 13. However, it is preferable that the second elastic members 38 are individually disposed at positions corresponding to the sensor areas 12b, since the load can be concentrated on the sensor areas 12b, thereby allowing the sensor electrode 13a to be reliably in press contact with the back surface of the sensor area 12b.

The second elastic member 38 can be made of a polymer elastic material 38a, which is the same material as the first elastic member 27 of the second embodiment. The second elastic member 38 preferably has a thickness in the range from 0.2 mm to 2 mm. When the thickness is less than 0.2 mm, there is a risk that a design allowance in mounting is not absorbed. On the other hand, when the thickness is more than 2 mm, the thickness does not effect on absorption of design allowance and workability in mounting, leading to unnecessary increase in thickness.

Since the exterior component 31 includes the second elastic member 38 between the mounting plate 14 and the sensor sheet 13, the second elastic member 38 can be in press contact with the sensor sheet 13 while performing compression deformation. Accordingly, within the range of this compression deformation, errors in dimension accuracy of the exterior member 12 and the mounting plate 14 can be absorbed.

Figure 7:
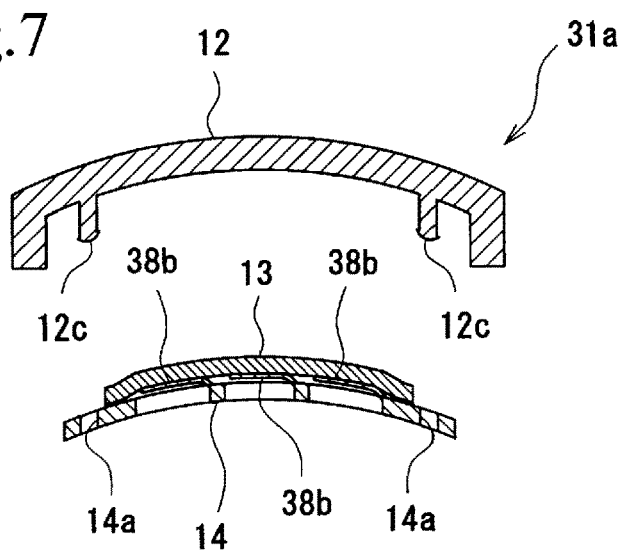
FIG. 7 is an exploded schematic cross sectional view corresponding to FIG. 4, which shows the exterior component that includes the second elastic member according to a modification example of the third embodiment.

Modification Example of Third Embodiment [FIG. 7]

As a modification example of the second elastic member 38, the elastic material can be replaced with a leaf spring 38*b*. The leaf spring 38*b* is continuous from the mounting plate 14 and is formed as a slit in the U-shape in plan view. FIG. 7 shows an exterior component 31*a* having the leaf spring 38*b*.

In the configuration in which the second elastic member 38 is made up of the leaf spring 38*b*, the second elastic member 38 can be in press contact with the sensor sheet 13 while performing compression deformation. Accordingly, within the range of this compression deformation, errors in dimension accuracy of the exterior member 12 and the mounting plate 14 can be absorbed.

When the leaf spring 38*b* is provided, the mounting plate 35 is preferably made up of a resin having spring elasticity. More specifically, polycarbonate resin, polyacetal resin, polyether ether ketone, a relatively hard rubber or elastomer having hardness of more than A60 in accordance with JIS K6253.

Combination of Embodiments

The features of configuration of the above embodiments can be modified unless they do not cause a problem and may be combined with the configuration of other embodiments. For example, the exterior component may include both the first elastic member and the second elastic member.

Although the first elastic member and the second elastic member included in the exterior component may be the same as the first elastic member 27 of the second embodiment and the second elastic member 38 of the third embodiment, respectively, the first elastic member 27 preferably has the thickness smaller than that of the second elastic member 38. Decreasing the thickness of the first elastic member 27 can decrease the distance from the front surface of the exterior member 12 to the sensor electrode 13*a* so as to improve the sensor sensitivity, and further, providing a sufficient thickness of the second elastic member 38 can absorb errors in dimension accuracy within the range of compression deformation.

When the first elastic member 27 and the second elastic member 38 are provided, the first elastic member 27 preferably has hardness lower than that of the second elastic member 38. In this configuration, the first elastic member 27 is compressed more than the second elastic member 38, thereby increasing followability to the back surface shape of the exterior member 12. Accordingly, the distance from the exterior member 12 to the sensor electrode 13*a* can be reduced so as to improve the sensor sensitivity.

Further, the outer shape of the second elastic member 38 is preferably larger than the outer shape of the first elastic member 27. If the second elastic member 38 is smaller than the first elastic member 27, the press contact of the first elastic member 27 may become non-uniform, which may cause variations in sensor sensitivity.

In the above example, the adhesive layer that adheres the sensor sheet 13 to the mounting plate 14 is provided on the sensor sheet 13. However, the adhesive layer may also be provided on the front surface of the mounting plate 14. When adhesive layer is provided on the front surface of the mounting plate 14, it can also adhere the sensor sheet 13 along the front surface shape of the mounting plate 14, and thus allows for close contact between the sensor sheet 13 and the exterior member 12.

EXAMPLE

As an exterior member, a box-shaped member made of 2 mm-thick polycarbonate resin and having one open end was provided. The other end of the exterior member was formed to have flat front and back surfaces. Further, as a mounting plate, 2 mm-thick flat polycarbonate resin plate was provided. The mounting plate had a front surface shape corresponding to the back surface shape of the exterior member, and was configured to engage with the other end (back surface) of the exterior member. Then, a sensor sheet was provided by a 100 μm-thick transparent PET film on which a sensor electrode was formed by using transparent conductive ink, a wiring was formed by silver ink, and a resist layer was formed by polyurethane resin ink. The following describes each of the examples.

Experiment Example 1

A double sided tape having a thickness of 50 μm was bonded on the front surface of the sensor sheet. The sensor sheet was bonded on the back surface of the exterior member to provide an exterior component as a sample 1. This exterior component was a conventional exterior component manufactured by a conventional manufacturing method. The exterior component did not include a mounting plate.

Experiment Example 2

As a first elastic member, a 100 μm-thick silicone rubber layer (upper elastic member A) was integrally formed on the front surface of the sensor sheet. After the sensor sheet provided with the first elastic member was fixed to the mounting plate by using a double sided tape, the mounting plate was engaged with the back surface of the exterior member so that the sensor sheet is in press contact with the back surface of the exterior member. Thus, an exterior component as a sample 2 was obtained.

Experiment Examples 3 to 6

Exterior components as samples 3 to 6 were obtained by the same method as Experiment example 2 except for the first elastic member having a different thickness.

Experiment Example 7

Experiment example 7 was the same as Experiment example 2 except that the sensor sheet was not provided with the first elastic member and the front surface of the sensor sheet was directly in contact with the back surface of the exterior member. Thus, an exterior component as a sample 7 was obtained.

Experiment Example 8

A sponge sheet (first elastic member B) was provided as a first elastic member. The sponge sheet was bonded on the front surface of the sensor sheet by using a double sided tape having a thickness of 50 μm thickness. An exterior component as a sample 8 was obtained by the same method as Experiment example 2 except for the above difference.

For each of the exterior components obtained in Experiment examples 1 to 8, repairability and sensor sensitivity were evaluated. The configuration and the evaluation for those examples were shown in Table 1.

disposed between the exterior member and the sensor sheet. Accordingly, it seemed that there was an effect by the short distance to the sensor sheet, since Experiment example 1 used a double sided tape having a thickness of 50 μm, which is thinner than the first elastic member in Experiment examples 2 to 6 and 8. Further, in Experiment example 7, although the distance is small, it seems that there was an effect by deterioration in adhesiveness between the exterior member and the sensor sheet due to the presence of an air layer.

Next, in comparison of the samples in Experiment examples 2 to 8 which used the mounting plate, Experiment example 3 showed the sensitivity (%) of 92.1% and Experiment example 2 showed 98%, while Experiment example 7 which did not use the first elastic member showed the sensitivity (%) of 91.6%. It was found that the sensitivity can

TABLE 1

| | | Experiment example 1 (Conventional example) | Experiment example 2 | Experiment example 3 | Experiment example 4 | Experiment example 5 | Experiment example 6 | Experiment example 7 | Experiment example 8 |
|---|---|---|---|---|---|---|---|---|---|
| Configuration | Mounting plate | No | Yes | Yes | Yes | Yes | Yes | Yes | Yes |
| | First elastic member | No | A | A | A | A | A | No | B |
| | Thickness (μm) | Double sided tape 50 | 100 | 250 | 500 | 700 | 1000 | — | 500 |
| Evaluation | Sensitivity (Diff) | 81.1 | 79.5 | 74.7 | 67 | 61.7 | 55.6 | 74.3 | 55.9 |
| | Sensitivity (%) | 100 | 98 | 92.1 | 82.2 | 76.1 | 68.5 | 91.6 | 68.9 |
| | Repairability | x | ○ | ○ | ○ | ○ | ○ | ○ | ○ |

Repairability: The removability of the mounting plate from the exterior member was evaluated as the repairability. The repairability were evaluated simply on the basis of feeling of easiness in removing the mounting plate from the exterior member, in which "easy to remove" was represented by "○" and "difficult to remove" was represented by "x".

Sensor sensitivity: For the exterior component in each of the experiment examples, a terminal was connected to PSoC®IC (CY8C24894 microcontroller, manufactured by Cypress Semiconductor Corporation) to measure the sensitivity (Diff). For the parameter settings of the PSoC®IC, Resolution was 13 bit (8192), Ref Value was 4, and Bleed resistor (Rb) was 3.3 KΩ. The sensitivity (Diff) was obtained by pressing a probe made of a conductive rubber formed in a cylindrical shape of 6 mm diameter (pusher; a substitute for a finger) at the center of the sensor electrode, and measuring the capacitance change before and after pressing the probe. Further, the sensitivity (%) was a relative value to the "sensitivity (Diff)" of Experiment example 1 taken as 100.

Evaluation of Properties: For the repairability, the exterior component of Experiment example 1 had difficulty in removing the sensor sheet from the exterior member. However, in the exterior components of Experiment examples 2 to 8, the exterior member and the sensor sheet were easily separated from each other.

For the sensor sensitivity, all the samples of Experiment examples 2 to 8 which used the mounting plate showed that the sensor sensitivity was lower than that of Experiment example 1 which was the conventional example. The sensor sensitivity depends on the distance from the front surface of the exterior member to the sensor sheet and the material be increased compared with the case without having the elastic member as long as the thickness of the first elastic member was 250 μm or less. Further, comparing Experiment examples 2 to 6, it was found that the sensor sensitivity was higher with decrease in thickness of the first elastic member.

Experiment example 8 which used a sponge sheet for the first elastic member showed the sensitivity lower than that of Experiment example 4 which used the first elastic member made of a silicone rubber of the same thickness. It seems that the sensitivity largely decreased since the sponge sheet had a low dielectric rate due to an effect of an included air. Accordingly, it was found that the first elastic member was preferably a material having high dielectric rate.

In addition, considering the prevention of error operation and the operational stability, although the higher sensitivity is preferable, the sensitivity may be substantially 50% of more of the conventional configuration, more preferably, 75% or more. When the sensitivity is less than 50%, error operation may occur due to an effect of noise. From the Experiment examples, it was found that the thickness of the elastic member was preferably 700 μm or less.

REFERENCE SIGNS LIST

11, 21, 31, 31*a* (sensor sheet-containing) exterior component
12 exterior member
12*a* display
12*b* sensor area
12*c* fitting projection
13 sensor sheet
13*a* sensor electrode
13*b* wiring 13c terminal section
14 mounting plate
14a fitting receiving member
16 adhesive layer
27 first elastic member
38 second elastic member
38a polymer elastic material
38b leaf spring

The invention claimed is:

1. A sensor sheet-containing exterior component comprising:
an exterior member which is exposed for operation;
a sensor sheet having a sensor electrode and disposed directly on a back surface of the exterior member; and
a mounting plate that holds the sensor sheet in close contact with the exterior member, wherein
the exterior member has a sensor area which is a sensing area correspond to the sensor electrode,
the sensor sheet used as a touch sensor sheet that the sensor electrode detects capacitance change,
the mounting plate has a front surface shape that corresponds to a back surface shape of the exterior member and is configured to engage with the exterior member,
a first elastic member is disposed between the exterior member and the sensor sheet, and
a sensor sheet-fixing unit is provided between the mounting plate and the sensor sheet so as to fix the sensor sheet to the mounting plate along the front surface shape of the mounting plate.

2. The sensor sheet-containing exterior component according to claim 1, wherein the mounting plate includes a mounting/dismounting unit which is detachably attached to the exterior member.

3. The sensor sheet-containing exterior component according to claim 1, wherein the first elastic member is individually disposed at positions corresponding to the sensor area.

4. The sensor sheet-containing exterior component according to claim 3, wherein the first elastic member has a thickness in a range of 50 μm to 700 μm.

5. The sensor sheet-containing exterior component according to claim 1, wherein a second elastic member is disposed between sensor sheet and the mounting plate.

6. A sensor sheet unit which is mounted for use on an exterior member which is exposed for operation, the sensor sheet unit comprising:
a sensor sheet having a sensor electrode and disposed directly on a back surface of the exterior member; and
a mounting plate that holds the sensor sheet in close contact with the exterior member, wherein
the exterior member has a sensor area which is a sensing area correspond to the sensor electrode,
the sensor sheet used as a touch sensor sheet that the sensor electrode detects capacitance change,
the mounting plate has a front surface shape that corresponds to a back surface shape of the exterior member and is configured to engage with the exterior member,
a first elastic member is disposed between the exterior member and the sensor sheet, and
a sensor sheet-fixing unit is provided between the mounting plate and the sensor sheet so as to fix the sensor sheet to the mounting plate along the front surface shape of the mounting plate.

7. The sensor sheet unit according to claim 6, wherein the mounting plate includes a mounting/dismounting unit which is detachably attached to the exterior member.

8. The sensor sheet unit according to claim 6, wherein the first elastic member is individually disposed at positions corresponding to the sensor area.

9. The sensor sheet unit according to claim 6, wherein a second elastic member is disposed between sensor sheet and the mounting plate.

10. A method for manufacturing a sensor sheet-containing exterior component according to claim 1, comprising:
fixing the sensor sheet to the mounting plate having a front surface shape that corresponds to a back surface shape of the exterior member by a sensor sheet-fixing unit that fixes the sensor sheet to the mounting plate along the front surface shape of the mounting plate; and then
engaging the front surface of the mounting plate to which the sensor sheet is fixed with the back surface of the exterior member.

11. The sensor sheet-containing exterior component according to claim 1, wherein the exterior member having a fitting projection extending from the back surface of the exterior member, and the mounting plate further includes a fitting receiving member configured to be engaged detachably with the fitting projection, so as to press the sensor sheet to the exterior member.

12. The sensor sheet unit according to claim 6, wherein the exterior member having a fitting projection extending from the back surface of the exterior member, and the mounting plate further includes a fitting receiving member configured to be engaged detachably with the fitting projection, so as to press the sensor sheet to the exterior member.

13. A method for manufacturing a sensor sheet-containing exterior component which includes
an exterior member having a plurality of sensor areas, which is exposed for operation,
a sensor sheet having a plurality of sensor electrodes and disposed directly on a back surface of the exterior member, each of sensor electrodes positioned and corresponding to each of the sensor areas, and
a mounting plate having a front surface shape that corresponds to a back surface shape of the exterior member, comprising:
fixing the sensor sheet to the mounting plate by an adhesive layer, a hot melt adhesive layer or a thermal welding layer; and then
attaching the mounting plate to the exterior member in a detachable manner so that each of the electrodes of the sensor sheet overlap each of the sensor areas of the exterior member.

* * * * *